(12) United States Patent
Goto et al.

(10) Patent No.: US 8,197,883 B2
(45) Date of Patent: Jun. 12, 2012

(54) METHOD FOR MAKING ELECTRO-OPTIC DEVICE AND LIQUID EJECTING DEVICE

(75) Inventors: Masashi Goto, Chino (JP); Shinri Sakai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 786 days.

(21) Appl. No.: 12/332,778

(22) Filed: Dec. 11, 2008

(65) Prior Publication Data

US 2009/0167808 A1  Jul. 2, 2009

(30) Foreign Application Priority Data

Dec. 26, 2007 (JP) ................................. 2007-333658

(51) Int. Cl.
*B41J 29/393* (2006.01)
(52) U.S. Cl. .......... 427/66; 347/19; 427/421.1; 427/256
(58) Field of Classification Search ................ 427/66
See application file for complete search history.

(56) References Cited

U.S. PATENT DOCUMENTS

2002/0064966 A1 * 5/2002 Seki et al. ..................... 438/780

FOREIGN PATENT DOCUMENTS

JP    A-2002-222695    8/2002

* cited by examiner

*Primary Examiner* — Philip Tucker
*Assistant Examiner* — Vicki Wu
(74) *Attorney, Agent, or Firm* — Oliff & Berridge, PLC

(57) ABSTRACT

A method for making en electro-optic device includes a filling step of ejecting liquid matter containing a solvent and a functional layer-forming material into recesses formed in a substrate to fill the recesses with the liquid matter; and a fixing step of removing a solvent component from the liquid matter to fix the functional layer-forming material in the recesses. In the filling step, the concentration of the functional layer-forming material in the liquid matter filling each recess is changed on the basis of the size of an opening width of the recess.

6 Claims, 16 Drawing Sheets

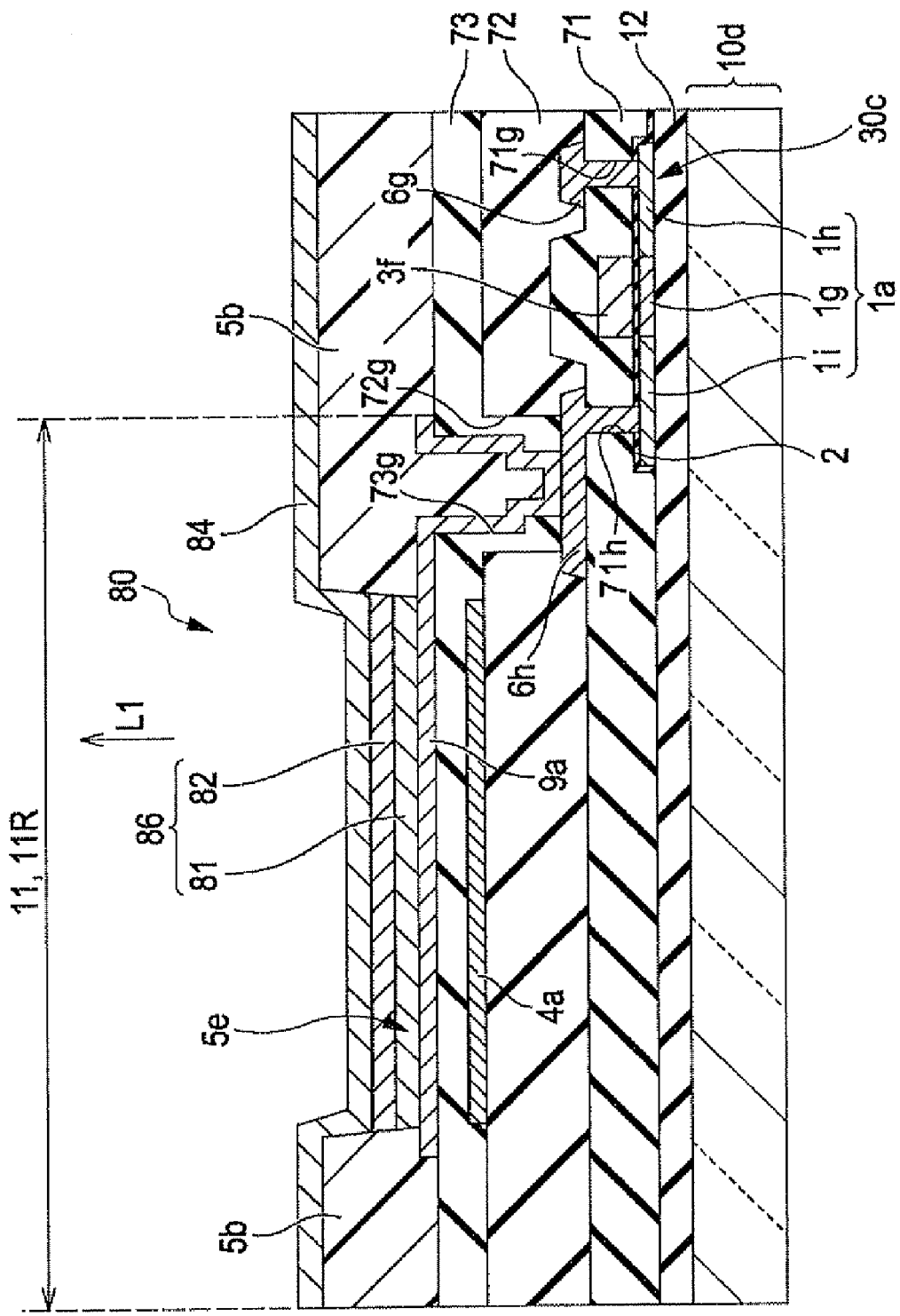

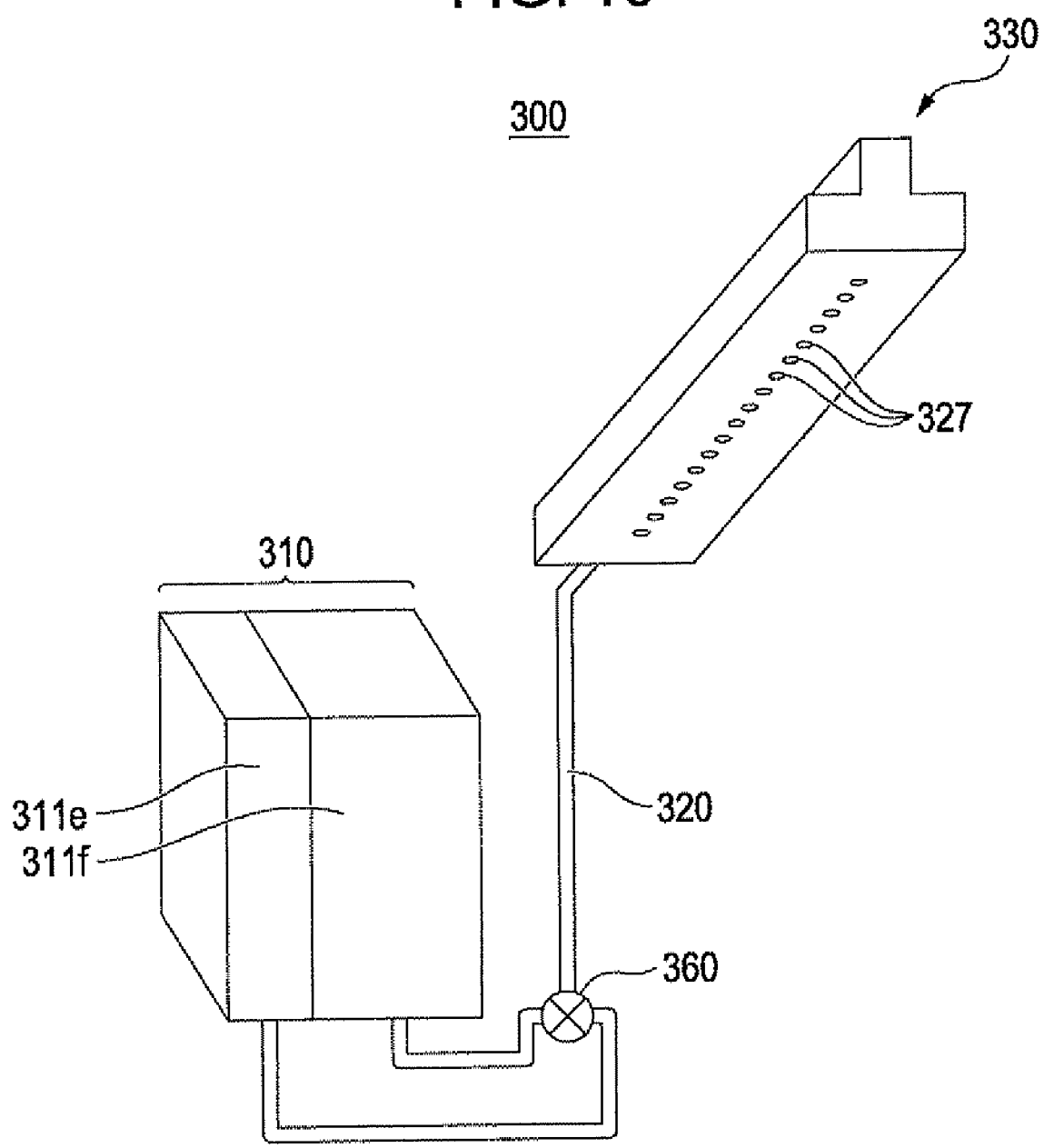

US 8,197,883 B2

METHOD FOR MAKING ELECTRO-OPTIC DEVICE AND LIQUID EJECTING DEVICE

BACKGROUND

1. Technical Field

The present invention relates to a method for making am electro-optic device such as an organic electroluminescent (hereinafter referred to as "organic EL") device and a liquid crystal device, and to a liquid-ejecting device that can be used in making the electro-optic device.

2. Related Art

Organic EL devices and liquid crystal devices, which are representative examples of the electro-optic devices, are being applied as display units of electronic apparatuses such as cellular phones, personal computers, and personal digital assistants (PDAs). Referring to FIGS. 12A, 12B, and 12C, organic EL elements of such organic EL devices are made by forming, on a substrate, a plurality of pixel electrodes and a recess 5e for defining a plurality of functional layer-forming regions for forming organic functional layers 86 such as emission layers on the pixel electrodes; ejecting liquid matter 85 from a liquid ejecting device into recesses 5e defined by the partition wall 5b to fill the recesses 5e with the liquid matter 85; and then removing the solvent component from the liquid matter 85 so as to form the organic functional layers 86 (refer to Japanese Unexamined Patent Application Publication No. 2002-222695).

In the case where such a method is employed, as shown in FIG. 12B, the liquid matter 85 preferably fills each recess 5e by forming a protruding meniscus to increase the amount of the liquid matter 85 filled in the recesses 5e and to thereby increase the thickness of the organic functional layer 86. This is to overcome the troubles that would occur when the functional layer-forming material is poorly soluble in the solvent and the problem of an increased viscosity that results when the functional layer-forming material is a highly concentrated polymer material.

The organic functional layers 86 formed as such have a thickness defined by the opening width and depth of the recesses 5e, the functional layer-forming material concentration in the liquid matter 85, and the contact angle between the liquid matter 85 and the partition wall 5b.

As shown in FIG. 12B, in the case where the liquid matter 85 fills each recess 5e by forming a protruding meniscus, the radius of curvature R of the arching surface of the meniscus is defined by the following equation on the basis of the opening width W of the recesses 5e and the contact angle θ with respect to the partition wall 5b, as shown in FIG. 13:

$$R = W/2 \sin\theta$$

The area S of the shaded area corresponding to the meniscus is expressed by the following equation:

$$S = (W^2/4 \sin\theta)(\theta/\sin\theta - \cos\theta)$$

Thus, in the case where the liquid matter 85 fills a recess 5e by forming a protruding meniscus at an contact angle of θ with respect to the partition wall 5b and where the opening width W is doubled without changing the depth of the recess 5e (height h of the partition wall 5b) or the functional layer-forming component concentration in the liquid matter 85, the amount of liquid matter 85 corresponding to the enlarged meniscus becomes four times as large. Since the amounts of liquid matter 85 filling the recesses 5e differ between those recesses 5e with a large opening width W and those recesses 5e with a small opening width W, the thickness d of the organic functional layer 86 formed in a recess 5e with a large opening width becomes larger than that formed in a recess 5e with a small opening width.

SUMMARY

An advantage of some aspects of the invention is that it provides a method for making an electro-optic device that can produce functional layers having the same thickness even when the functional layers are formed by removing the solvent from the liquid matter filling recesses having different opening widths. A liquid ejection device used in this method is also provided.

An aspect of the invention provides a method for making en electro-optic device, including a filling step of ejecting liquid matter containing a solvent and a functional layer-forming material into recesses formed in a substrate to fill the recesses with the liquid matter; and a fixing step of removing a solvent component from the liquid matter to fix the functional layer-forming material in the recesses. In the filling step, the concentration of the functional layer-forming material in the liquid matter filling each recess is changed on the basis of the size of an opening width of the recess.

In implementing the method described above, a liquid ejecting device is used. The liquid ejecting device includes a liquid matter supplying unit for supplying liquid matter containing a solvent and a functional layer-forming material; an ejecting head having nozzle openings for ejecting the liquid matter toward recesses formed in a substrate for an electro-optic device; and a channel that connects the liquid matter supplying unit to the ejecting head. The functional layer-forming material concentration of the liquid matter ejected from the ejecting head and filling each recess is changed on the basis of the opening width of the recess.

In the filling step, the liquid matter may fill each recess until the liquid matter forms a protruding meniscus; and the liquid matter filling a recess having a relatively small opening width may have a functional layer-forming material concentration higher than that of the liquid matter filling a recess having a relatively large opening width. In other words, the liquid ejecting device may fill the recesses with the liquid matter until protruding meniscuses are formed so that the liquid matter filling a recess having a relatively small opening width has a functional layer-forming material concentration higher than that of the liquid matter filling a recess having a relatively large opening width.

The concentration of the functional layer-forming material in the liquid matter filling the recesses may be changed on the basis of the size of the opening width by using a plurality of types of liquid matter having different functional layer-forming material concentrations and adjusting the balance of amounts of the plurality of types of liquid matter to be ejected into each recess according to the size of the opening width.

In the liquid ejecting device for implementing this process, the liquid matter supplying unit may include a plurality of concentration-set liquid matter supplying subunits for respectively supplying a plurality of types of liquid matter having different functional layer-forming material concentrations. The nozzle openings of the ejecting head may include a plurality of types of concentration-set nozzle openings respectively connected to the plurality of concentration-set liquid matter supplying subunits, the plurality of types of concentration-set nozzle openings respectively ejecting the plurality of types of liquid matter having different functional layer-forming material concentrations. The plurality of types of liquid matter may be ejected from the plurality of types of concentration-set nozzle openings into each recess. The balance of amounts of the plurality of types of liquid matter to be ejected into each recess may be adjusted according to the size of the opening width of the recess.

According to this structure, all recesses having various different opening widths can be filled with liquid matter having the optimum functional layer-forming material concentration.

Alternatively, the concentration of the functional layer-forming material in the liquid matter filling the recesses may be changed on the basis of the size of the opening width by adjusting the functional layer-forming material concentration of the liquid matter to be ejected to each recess according to the size of the opening width.

In order to do so, the liquid matter supplying unit may include a plurality of liquid matter supplying subunits for respectively supplying a plurality of types of liquid matter having different functional layer-forming material concentrations. The nozzle openings of the ejecting head may include a plurality of types of nozzle openings respectively connected to the plurality of liquid matter supplying subunits. The liquid matter may be ejected to each recess from one of the nozzle openings. Which of the nozzle openings is used to eject the liquid matter to each recess may be controlled according to the size of the opening width of the recess.

Alternatively, the liquid matter supplying unit may include a plurality of concentration-set liquid matter supplying subunits for respectively supplying a plurality of types of liquid matter having different functional layer-forming material concentrations. Each recess may be filled with the liquid matter stored in one of the plurality of concentration-set liquid matter supplying subunits and ejected from the nozzle opening. From which of the plurality of liquid matter supplying subunits the liquid matter should be ejected to the recess through the nozzle opening may be controlled according to the size of the opening width of the recess.

Alternatively, the liquid matter supplying unit may include a plurality of liquid material reservoirs respectively storing a plurality of liquid materials for preparing the liquid matter. The plurality of liquid materials may be mixed to form the liquid matter and the liquid matter is supplied to the ejecting head. The mixing ratio of the plurality of the liquid materials may be controlled according to the size of the opening width of each recess.

The recesses having different opening widths may be formed on a different substrate or the same substrate. The functional layer-forming material may be used to form an organic functional layer of an organic electroluminescent element on the substrate. In other words, ah organic EL device may be formed. A color filter substrate for use in an electro-optic device such as an organic EL device or a liquid crystal device can also be made. In such a case, the functional layer-forming material is used to form a color filter on a substrate.

The electro-optic device made by this method may be used as light sources, display units of electronic apparatuses such as cellular phones, mobile computers, etc.

BRIEF DESCRIPTION OF THE DRAWINGS

The invention will be described with reference to the accompanying drawings, wherein like numbers reference like elements.

FIG. 3B is a cross-sectional view of one pixel.

FIG. 10 is a diagram showing a structure for optimizing the functional layer-forming material concentration in the liquid matter as shown in FIG. 7 for an organic EL device and a liquid ejecting device of a fourth embodiment.

DESCRIPTION OF EXEMPLARY EMBODIMENTS

Figure 12A:
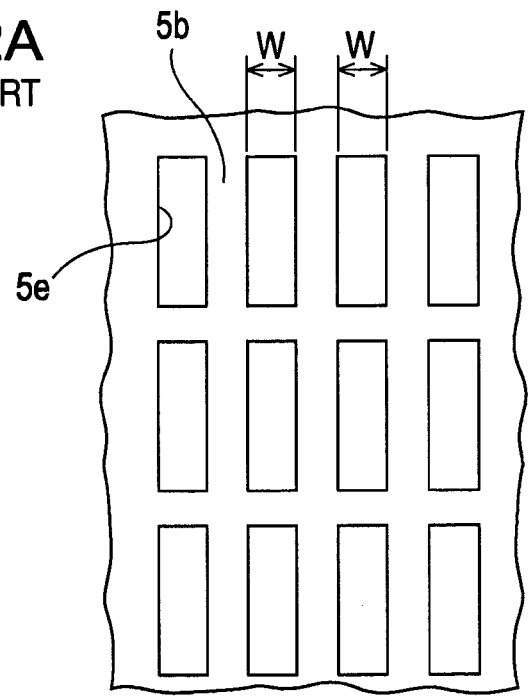
FIGS. 12A to 12C whos a method for making organic functional layers by ejecting liquid matter into recesses surrounded by a partition wall formed on an element substrate according to a method for making an organic EL device of related art.
Figure 12B:
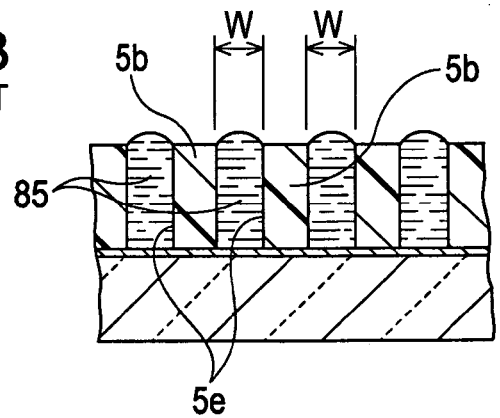
Figure 12C:
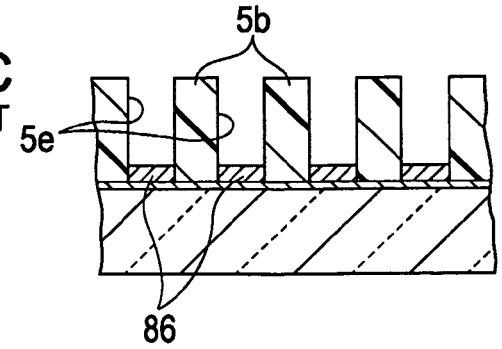

Embodiments of the invention will now be described. In the drawings referred to in the following description, layers and components are independently depicted at different scales so that they are clearly identifiable in the drawing. In thin film transistors (TFTs), the source and drain are switched between each other according to the applied voltage. For the sake of simplicity, the description below assumes the electrode connected to the pixel electrode to be the drain. Moreover, components that have the same functions as those depicted in FIGS. 12A to 12C are represented by the same reference numerals in the description below so that the correspondence between the components is readily understandable.

First Embodiment

Figure 1:
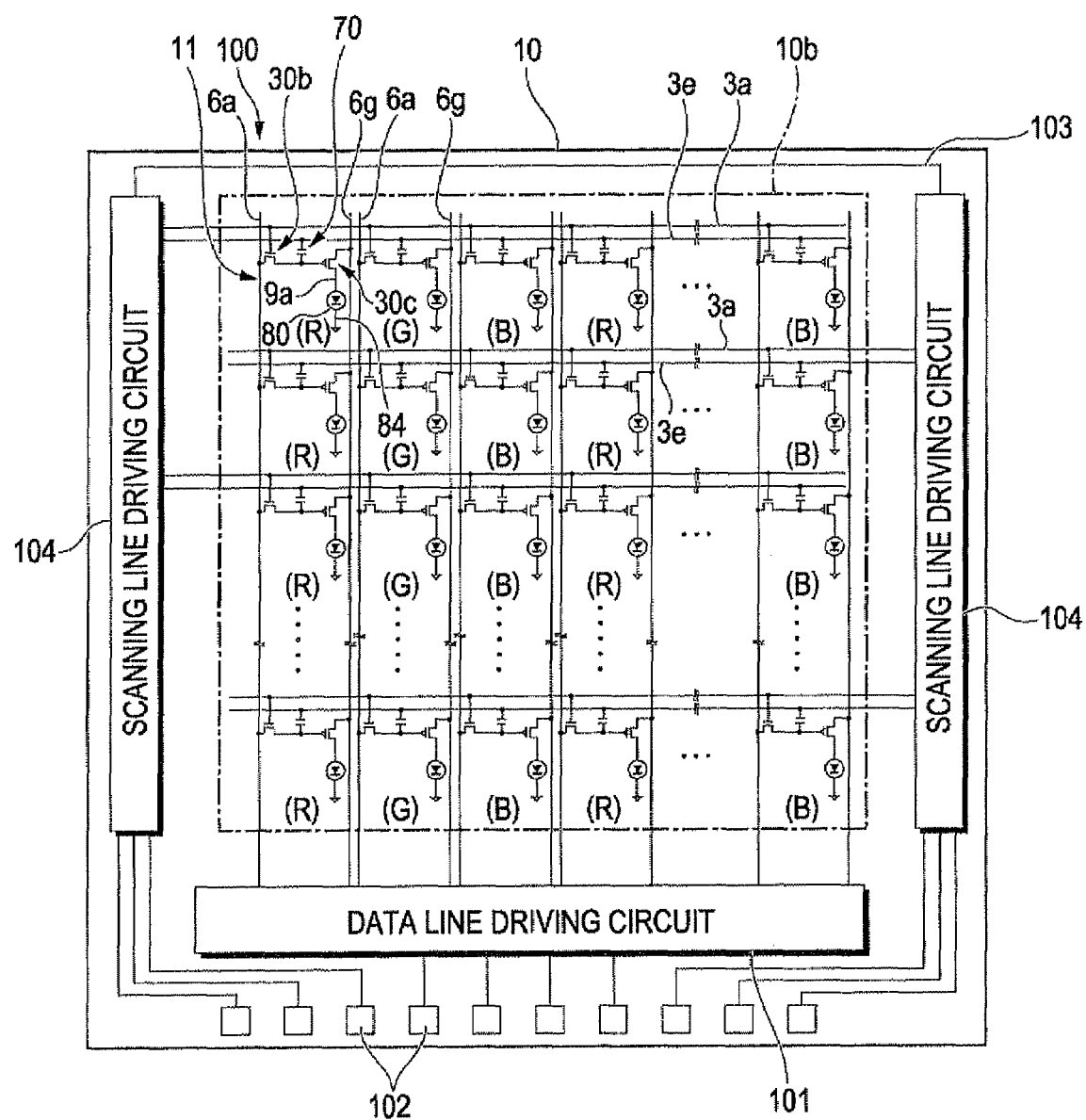
FIG. 1 is an equivalent circuit showing an electrical configuration of an element substrate of an electro-optic device (organic EL device) according to a first embodiment.
Figure 2A:
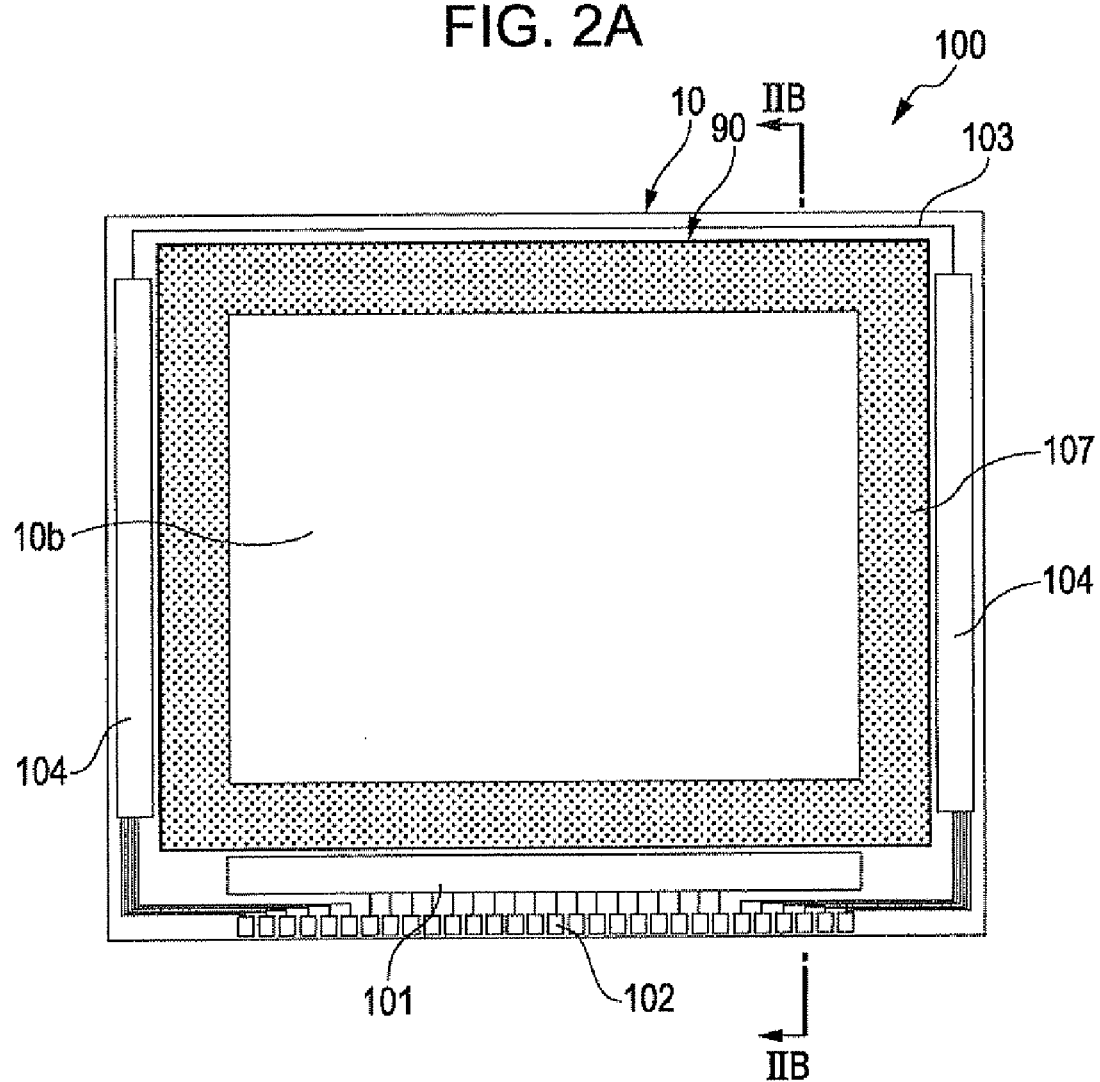
FIG. 2A is a plan view of the electro-optic device and its constituent elements of the first embodiment as viewed from a counter-substrate-side.

FIG. 1 is a block diagram showing the electrical configuration of an electro-optic device according to a first embodiment. FIG. 2A is a plan view of the electro-optic device and its constituent elements as viewed from a counter-substrate-side, and FIG. 2B is a cross-sectional view taken along line IIB-IIB in FIG. 2A.

An electro-optic device 100 shown in FIG. 1 is an organic EL device and includes an element substrate 10 on which a plurality of scanning lines 3a, a plurality of data lines 5a extending in a direction orthogonal to the scanning lines 3a, and a plurality of pixels 11 disposed at the intersections of the scanning lines 3a and the data lines 6a. The region in which the pixels 11 are arranged in a matrix is a pixel region 10b. A plurality of power lines 6g parallel to the data lines 6a and a plurality of capacitance lines 3e parallel to the scanning lines 3a are also disposed on the element substrate 10. The data lines 6a are connected to a data line driving circuit 101, and the scanning lines 3a are connected to scanning line driving circuits 104. Each of the pixels 11 includes a switching TFT 30b having a gate electrode to which a scanning signal is fed via the scanning line 3a, a retention capacitance 70 that retains a pixel signal fed from the data line 6a via the switching TFT 30b, a driving TFT 30c having a gate electrode to which the pixel signal retained in the retention capacitance 70 is fed, a first electrode layer 9a (pixel electrode/anode layer) in which a driving current from the power line 6g flows when electrically connected to the power line 6g via the driving TFT 30c, and an organic EL element 80 having an organic functional layer sandwiched between the first electrode layer 9a and a second electrode layer 84 (cathode). According to the configuration shown in FIG. 1, the power lines 6g extend from the data line driving circuit 101 and the capacitance lines 3e extend from the scanning line driving circuits 104. Alternatively, since constant voltage is applied, the power lines 6g and the capacitance lines 3e may directly extend from terminals 102, or other arrangements can be taken. According to the configuration shown in FIG. 1, the capacitance lines 3e are formed parallel to the scanning lines 3a. Alternatively, the capacitance lines 3e may be omitted and the retention capacitance 70 may be formed between the power line 6g and the drain of the switching TFT 30b.

According to this electro-optic device 100, once the scanning line 3a is driven and the switching TFT 30b is turned ON, the potential of the data line 6a at that time is retained in the retention capacitance 70. The driving TFT 30c is turned ON or OFF according to the charge retained in the retention capacitance 70. Electrical current flows from the power line 6g to the first electrode layer 9a via the channel of the driving TFT 30c, and into the second electrode layer 84 via the organic functional layer. As a result, the organic EL element 80 emits light according to the amount of current flowing therein.

Figure 2B:
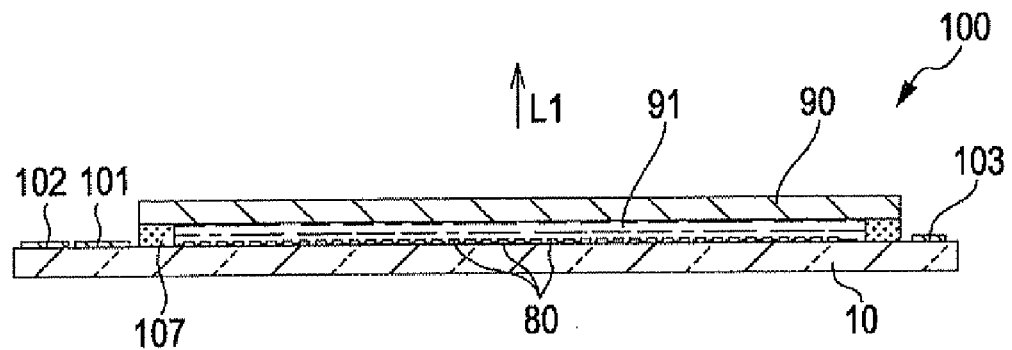
FIG. 2B is a cross-sectional view taken along line IIB-IIB in FIG. 2A.

Referring to FIGS. 2A and 2B, the electro-optic device 100 has the element substrate 10 and a sealing substrate 90 bonded to each other with a sealing material 107. A filler layer 91 composed of light-transmitting epoxy resin is interposed between the element substrate 10 and the sealing substrate 90. The data line driving circuit 101 and the terminals 102 made of indium tin oxide (ITO) films are formed in a region of the element substrate 10 outside the sealing material 107. The data line driving circuit 101 and the terminals 102 are formed along one side of the element substrate 10, and two scanning line driving circuit 104 are respectively disposed along two sides adjacent to the side along which the terminals 102 are disposed. A plurality of interconnections 103 for connecting between the scanning line driving circuits 104 respectively provided at two sides of the pixel region 10b are disposed along the remaining side of the element substrate 10. The element substrate 10 includes the organic EL element 80 having a first electrode layer, an organic functional layer, and a second electrode layer sequentially stacked in that order, and a plurality of such organic EL elements 80 are arranged into a matrix, as described in detail below. Instead of providing the sealing substrate 90, the element substrate 10 may simply be covered with a sealing resin.

Detailed Structure of Pixel

Figure 3A:
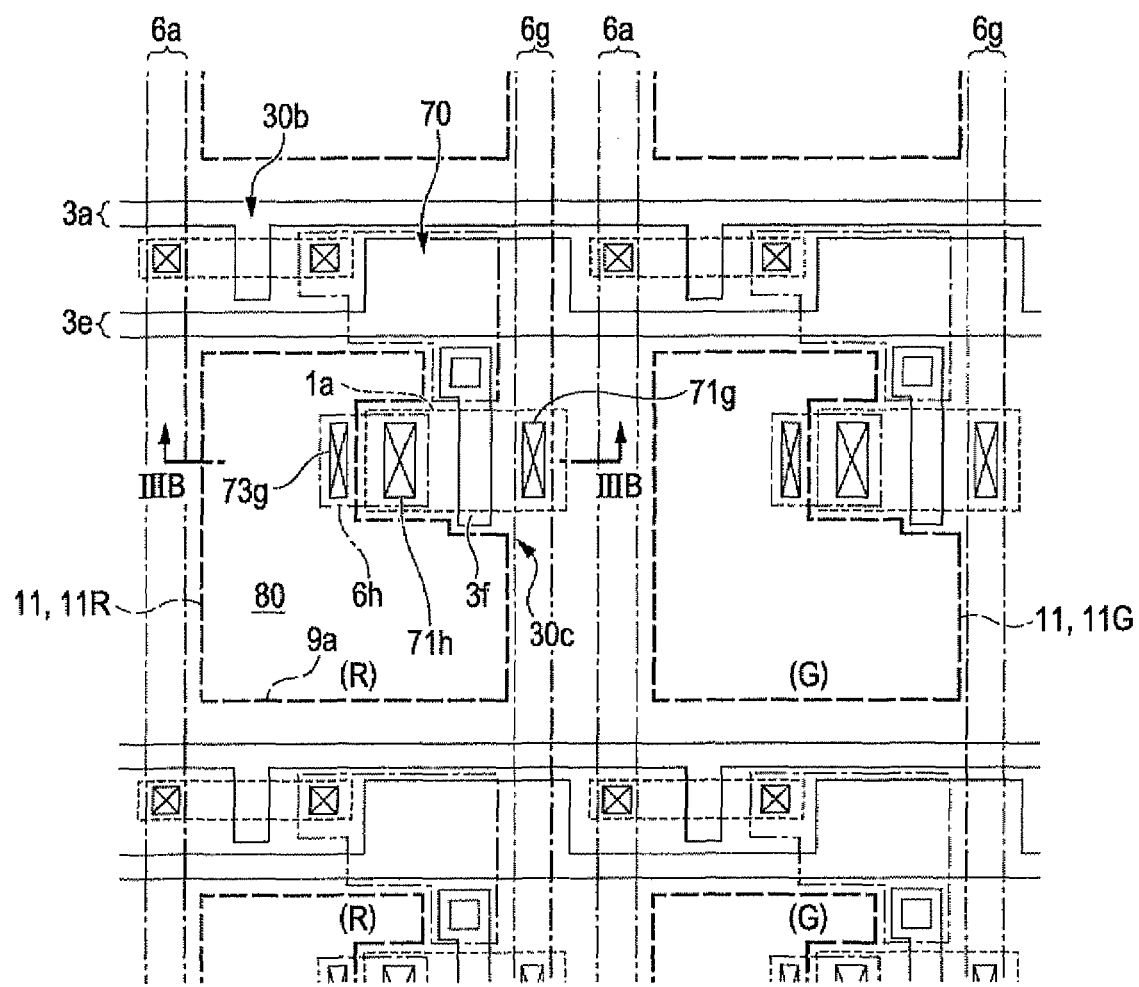
FIG. 3A is a plan view of two adjacent pixels of the electro-optic device according to the first embodiment.

FIG. 3A is a plan view of two adjacent pixels of the electro-optic device 100 according to the first embodiment of the invention, and FIG. 3B is a cross-sectional view of one pixel. FIG. 3B is a cross-sectional view taken at line III-IIIB in FIG. 3A. In FIG. 3A, the first electrode layers 9a are marked by long dashed lines, the data lines 6a and the thin films formed simultaneously are marked by long-dashed short-dashed lines, and the scanning lines 3a are marked by solid lines. Semiconductor layers are marked by short dashed lines. In FIG. 3A, the positions of the components are altered so that the arrangement of the components can be easily recognized.

As shown in FIGS. 3A and 33, a plurality of transparent first electrode layers 9a (regions surrounded by long dashed lines) are arranged in a matrix on the element substrate 10. One first electrode layer 9a is provided for every pixel 11 the data lines 6a (regions marked by long-dashed short-dashed lines), the power lines 6g (regions marked by long-dashed short-dashed lines), the scanning lines 3a (regions marked by solid lines), and the capacitance lines 3e (regions marked by solid lines) are arranged along horizontal and vertical boundary regions of the first electrode layers 9a.

As shown in FIG. 3B, the element substrate 10 includes a base member, i.e., a supporting substrate 10d, and an insulating underlayer 12 made of a silicon oxide film or the like formed on the supporting substrate 10d. The driving TFT 30c is formed on the surface of the element substrate 10 in the region corresponding to the first electrode layer 9a. The driving TFT 30c includes an island-shaped semiconductor layer 1a, a channel region 1g, a source region 1h, and a drain region 1i. An gate insulating layer 2 is formed on a surface of the semiconductor layer 1a, and a gate electrode 3f is formed on the surface of the gate insulating layer 2. The gate electrode 3f is electrically connected to the drain of the switching TFT 30b. The basic structure of the switching TFT 30b is the same as the driving TFT 30c. Thus, detailed description therefor is omitted.

An interlayer insulating film 71 made of a silicon oxide film or a silicon nitride film, an interlayer insulating film 72 (planarizing film) 1.5 to 2.0 μm in thickness composed of a photosensitive resin, and a light-transmitting insulating film 73 made of a silicon nitride film or the like are formed above the driving TFT 30c. The data line 6a (not shown in FIG. 3B), the power line 6g, and a drain electrode 6h are formed on a surface of the interlayer insulating film 71 (at the interface between the interlayer insulating film 71 and the interlayer insulating film 72). The power line 6g is electrically connected to the source region 1h via a contact hole 71g formed in the interlayer insulating film 71. The drain electrode 6h is electrically connected to the drain region 1i via the a contact hole 71h formed in the interlayer insulating film 71. In this embodiment, the data line 6a, the power line 6g, and the power line 6g are each a metal single film composed of one of molybdenum, aluminum, titanium, tungsten, tantalum, chromium, and the like, or a multilayer film of these metals.

The first electrode layer 9a made of an ITO film is formed on the surface of the light-transmitting insulating film 73. The first electrode layer 9a is electrically connected to the drain electrode 6h via contact holes 72g and 73g formed in the interlayer insulating films 72 and 73.

A thick partition wall 5b composed of photosensitive resin or the like and having an opening for defining a light-emitting region is formed above the first electrode layer 9a. Organic functional layers 86 such as a light-emitting layer 82 and a hole injection layer 81 composed of 3,4-polyethylenedioxythiophene/polystyrene sulfonate (PEDOT/PSS) or the like are formed on the first electrode layer 9a in the recess 5e surrounded by the partition wall 5b. A second electrode layer 84 is formed on the light-emitting layer 82. As described above, the first electrode layer 9a, the hole injection layer 81, the light-emitting layer 82, and the second electrode layer 84 constitute the organic EL element 80. The light-emitting layer 82 is composed of a polyfluorene derivative, a polyphenylene derivative, a polyvinylcarbazole, or a polythiophene derivative undoped or doped with a perylene-based dye, a coumarin-based dye, or a rhodamine-based dye, such as rubrene, perylene, 9,10-diphenylanthracene, tetraphenylbutadiene, nile red, coumarin 6, quinacridone, or the like. The light-emitting layer 82 is preferably composed of a π-conjugated polymer having π electrons of a double bond delocalized on the polymer chain since such a polymer is electrically conductive and has superior emission performance. In particular, a compound having a fluorene skeleton in the molecule, i.e., a polyfluorene-based compound, is preferred. Instead of these materials, a composition containing a precursor of a conjugated polymer organic compound and at least one type of fluorescent dye for changing the light-emitting characteristics can also be used. In this embodiment, the organic functional layer 86 is formed by an application method, such as an inkjet method described below. An electron injection layer may be formed between the light-emitting layer 82 and the second electrode layer 84.

The electro-optic device 100 of this embodiment is a top-emission organic EL device. Light is output from the side of the supporting substrate 10d at which the organic EL element 80 is formed, as shown by arrow L1 in FIG. 3B. Thus, a light-reflecting layer 4a is formed between the interlayer insulating film 72 and the light-transmitting insulating film 73. The second electrode layer 84 is formed as a light-transmitting electrode made of an ITO film or the like whose work function is adjusted by depositing a thin film or aluminum, magnesium, lithium, or the like. The supporting substrate 10d may be a transparent substrate made of glass or the like, or an opaque substrate. Examples of the opaque substrate include a ceramic plate composed of alumina or the like and a metal plate composed of stainless steel or the like subjected to insulating treatment such as surface oxidation, and a resin substrate. In the case where the electro-optic device 100 is a bottom-emission organic EL device, light is output from the supporting substrate 10d-side. In such a case, the supporting substrate 10d is a transparent substrate composed of glass or the like and no light-reflecting layer 4a is formed.

Structure of Ejecting Head

Figure 4A:
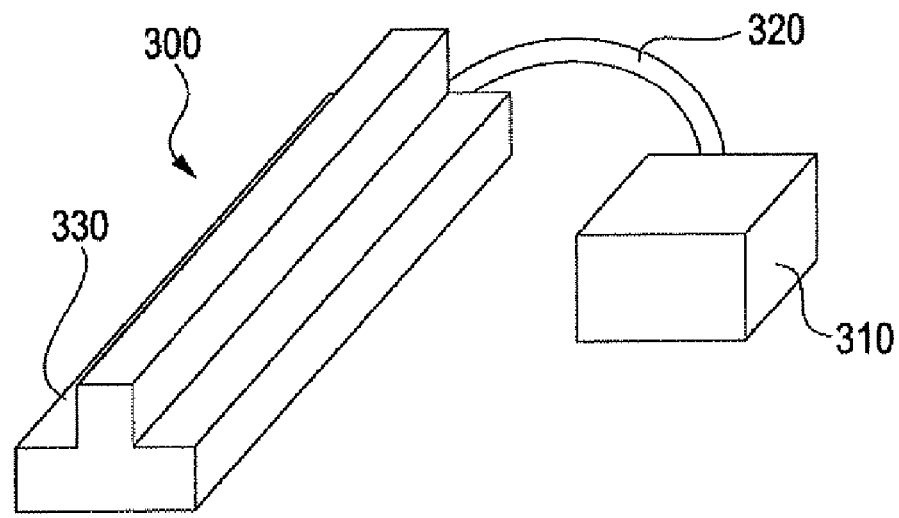
FIGS. 4A to 4D are diagrams illustrating a liquid ejecting device used in making an organic EL device.
Figure 4B:
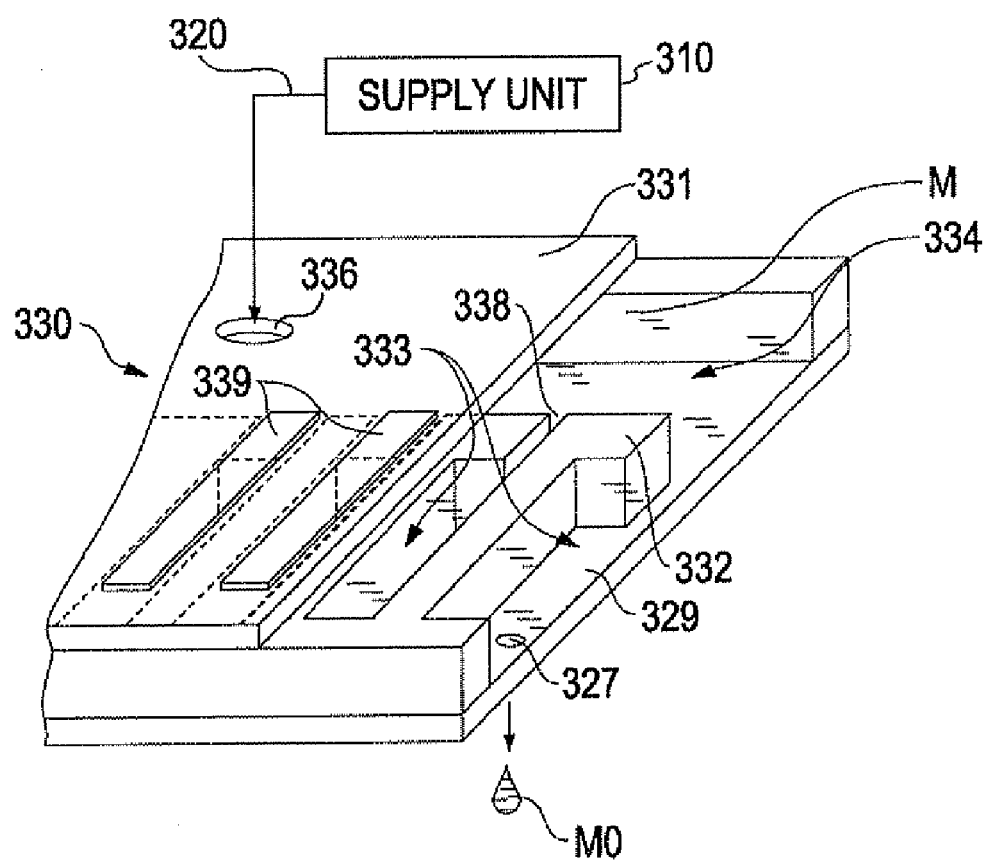
Figure 4C:
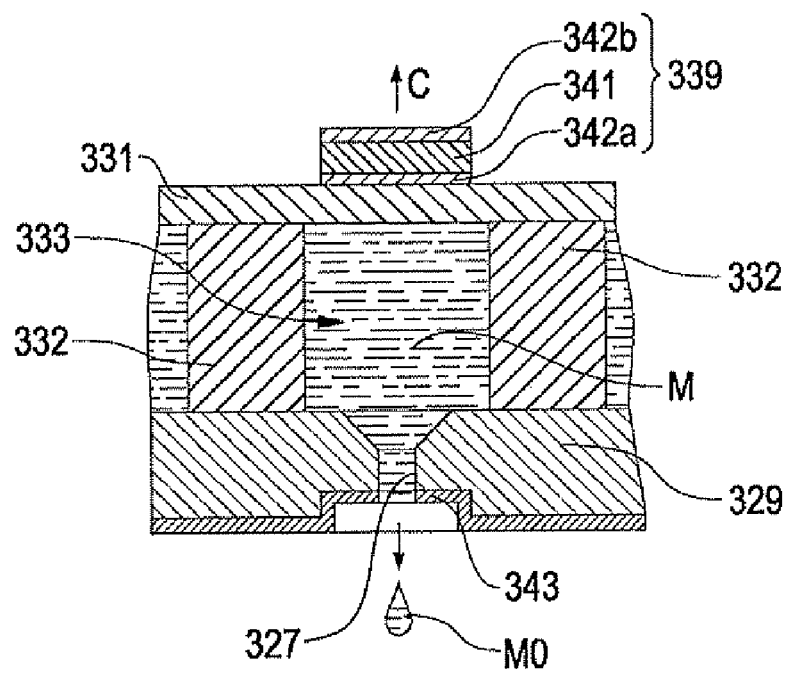
Figure 4D:
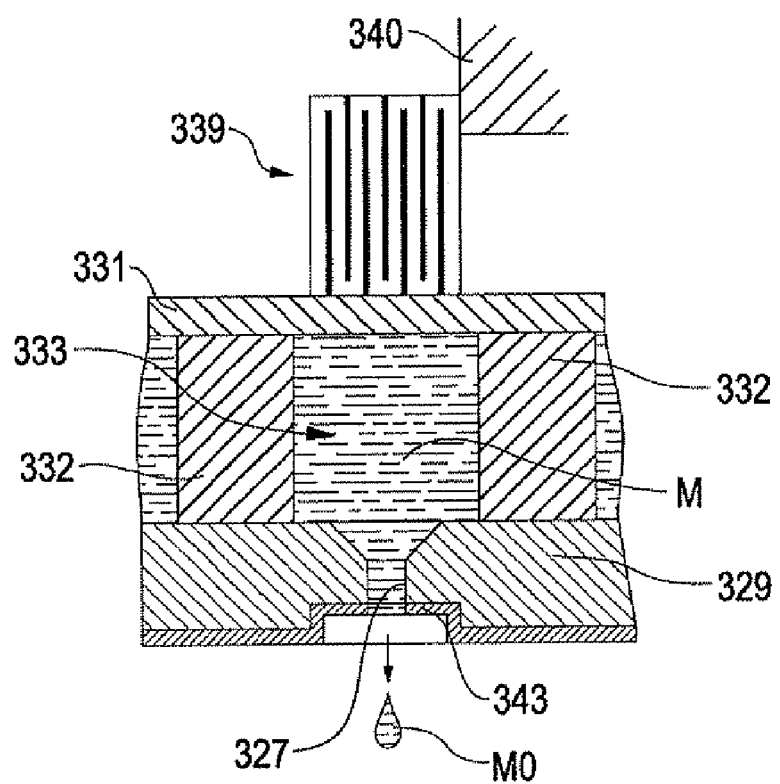

FIGS. 4A to 4D are diagrams illustrating a liquid ejecting device used in making the electro-optic device 100. FIG. 4A is a perspective view showing the main portion of the liquid ejecting device used in making an organic EL device 1 of this embodiment. FIG. 4B is a perspective view illustrating an internal structure of a ejecting head. FIG. 4C is a cross-sectional view showing a flexural vibration-mode pressure-generating element. FIG. 4D is a cross-sectional view showing a longitudinal vibration-mode pressure-generating element.

The organic EL device 1 is made as follows. First, the organic functional layers 86 such as the hole injection layer 81 and the light-emitting layer 82 described with reference to FIGS. 3A and 3B are formed with a liquid-ejecting apparatus 300. The liquid-ejecting apparatus 300 includes a liquid matter supplying unit 310 for supplying liquid matter that contains a solvent and a functional layer-forming material for forming the organic functional layers 86 such as the hole injection layer 81 and the light-emitting layer 82; and an ejecting head 330 connected to the liquid matter supplying unit 310 via a channel 320. As shown in FIG. 4B, a plurality of nozzle openings 327 are formed in the ejecting head 330.

Referring to FIG. 4B, the ejecting head 330 has a nozzle row constituted by many nozzle openings 327 arranged in a line. The nozzle row of the ejecting head 330 extends in a sub scanning direction orthogonal to the main scanning direction. While the ejecting head 330 is moved in the main scanning direction, the liquid matter M is ejected at predetermined timings from the nozzle openings 327 so as to allow droplets M0 to land on predetermined positions on the element substrate 10. The positions to be main-scanned by the ejecting head 330 can be shifted by a desired distance by moving the ejecting head 330 in a parallel manner by the desired distance in the sub scanning direction.

As shown in FIGS. 4B and 4C, the ejecting head 330 includes, for example, a nozzle plate 329 made of stainless steel, a flexible plate 331 opposing the nozzle plate 329, and a plurality of partitions 332 for joining the nozzle plate 329 to the flexible plate 331. A plurality of pressure-generating chambers 333 and liquid reservoirs 334 are formed between the nozzle plate 329 and the flexible plate 331 by the partitions 332. The pressure-generating chambers 333 are communicated with the liquid reservoirs 334 through liquid matter inlets 338. Liquid matter supply holes 336 are formed at appropriate positions of the flexible plate 331, and the liquid matter supply holes 336 are connected to the liquid matter supplying unit 310. In this manner, the liquid matter supplying unit 310 supplies the liquid matter supply hole 336 with the liquid matter M to be ejected. The supplied liquid matter M fills the liquid reservoir 334, passes through the liquid matter inlet 338, and fills the pressure-generating chamber 333. As described above, the liquid matter supplying unit 310 is communicated with the pressure-generating chambers 333 in such a manner.

The nozzle plate 329 has the nozzle openings 327 for ejecting droplets M0 of the liquid matter M from the pressure-generating chamber 333. The nozzle-forming face of the nozzle plate 329 in which the nozzle openings 327 are opened is flat. As described above, the nozzle openings 327 are formed in the pressure-generating chambers 333. Pressure-generating elements 339 are disposed on a surface of the flexible plate 331 opposite to the surface on which the pressure-generating chambers 333 are formed. The pressure-generating elements 339 are formed at positions corresponding to the pressure-generating chambers 333. Each pressure-generating element 339 is, for example, a flexural vibration-mode piezoelectric device having a piezoelectric element 341 and a pair of electrodes 342a and 342b sandwiching the piezoelectric element 341, as shown in FIG. 4C. The direction of vibration is shown by arrow C. Alternatively, a longitudinal vibration mode piezoelectric device shown in FIG. 4D may be used as the pressure-generating element 339. The longitudinal vibration-mode piezoelectric element (pressure-generating element 339) has a piezoelectric material and a conductive material alternately stacked in the longitudinal direction with one end fixed to the flexible plate 331 and the other end fixed to a base 340. Such a pressure-generating element 339 contracts in a direction perpendicular to the stacking direction of the conductive layers under a charging state and expands in a direction perpendicular to the conductive layers once released from the charging state.

The pressure-generating chambers 333 are deformed, i.e., expanded and contracted, by a driving signal applied between the electrodes irrespective of which type of the piezoelectric element is used. A liquid repelling layer 343 such as a Ni-tetrafluoroethylene eutectoid plating layer is provided around the nozzle opening 327 to prevent the droplets M0 from travelling a curved flight path and the nozzle openings 327 from clogging, for example.

Method for Making Organic EL Device

A step of forming the organic functional layers 86 of a method for making the organic EL device will now be described with reference to FIGS. 5 to 8. Of the organic functional layers 86, the light-emitting layer 82 and the hole injection layer 81 are basically made by the same method except for the material used. In the description below, the material for forming the light-emitting layer 82 or the hole injection layer 81 (organic functional layer 86) is referred to as "functional layer-forming material", and the functional material blended with a solvent is referred to as "liquid matter 35". In some cases, a different type of material is used for the organic functional layer 86 depending on the color. However, in the description below, the material for forming the light-emitting layer 82 or the hole injection layer 81 (organic functional layer 86) is simply referred to as "functional layer-forming material" irrespective of the type of material, and the functional layer-forming material blended with a solvent is referred to as "liquid matter 85".

Figure 5:
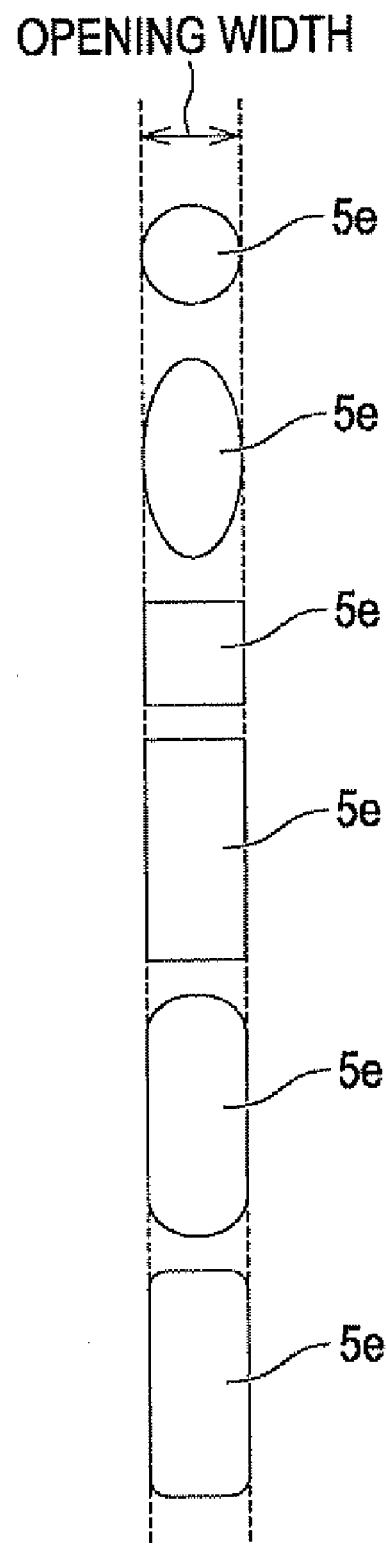
FIG. 5 is a diagram for describing the definition of the opening width of a recess surrounded by a partition wall in the organic EL device.
Figure 6A:
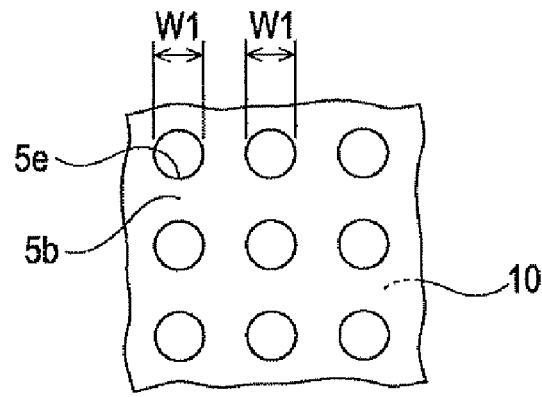
FIGS. 6A to 6F are diagrams illustrating a method for making organic functional layers by ejecting liquid matter into recesses surrounded by the partition wall formed on an element substrate, in a method for making the organic EL device.
Figure 6B:
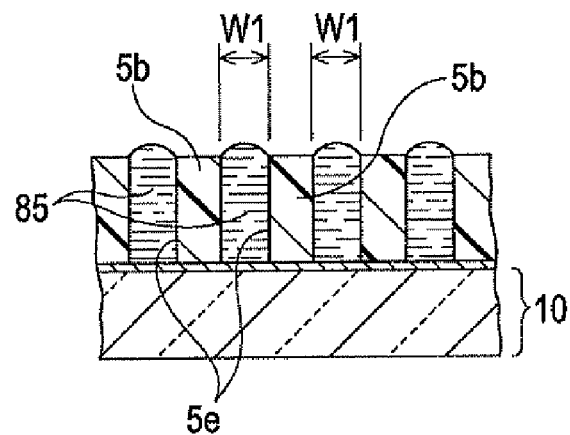
Figure 6C:
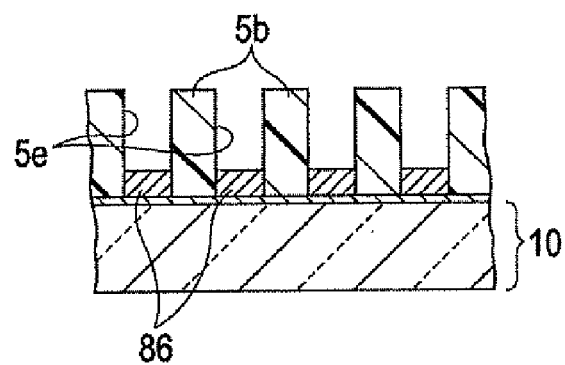
Figure 6D:
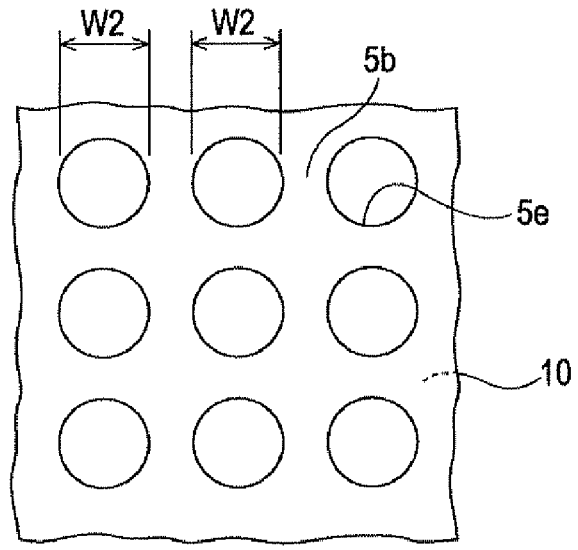
Figure 6E:
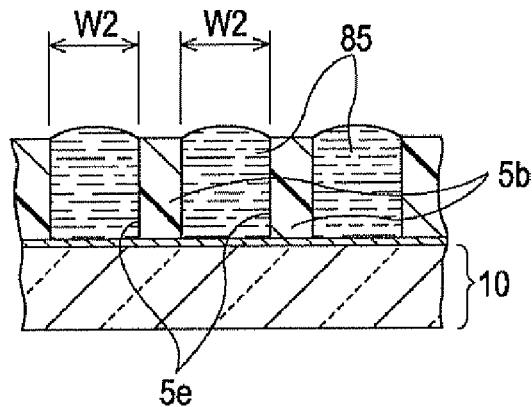
Figure 6F:
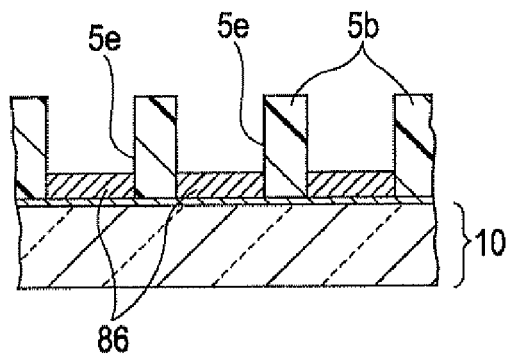
Figure 7:
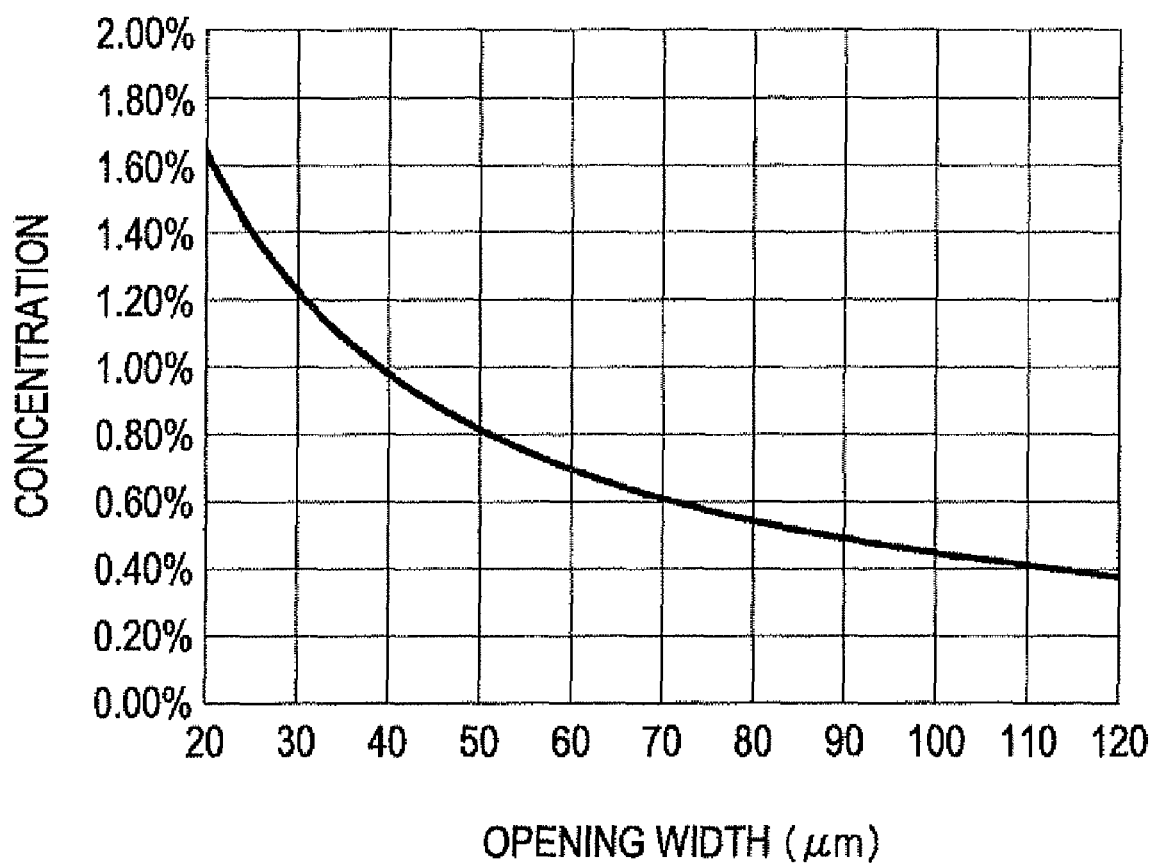
FIG. 7 is a graph showing the optimum relationship between the opening width of the recess surrounded by the partition wall and the functional layer-forming material concentration in the liquid matter to be filled in the recess in order to form the organic functional layer 100 nm in thickness according to the method of making the organic EL device.
Figure 8:
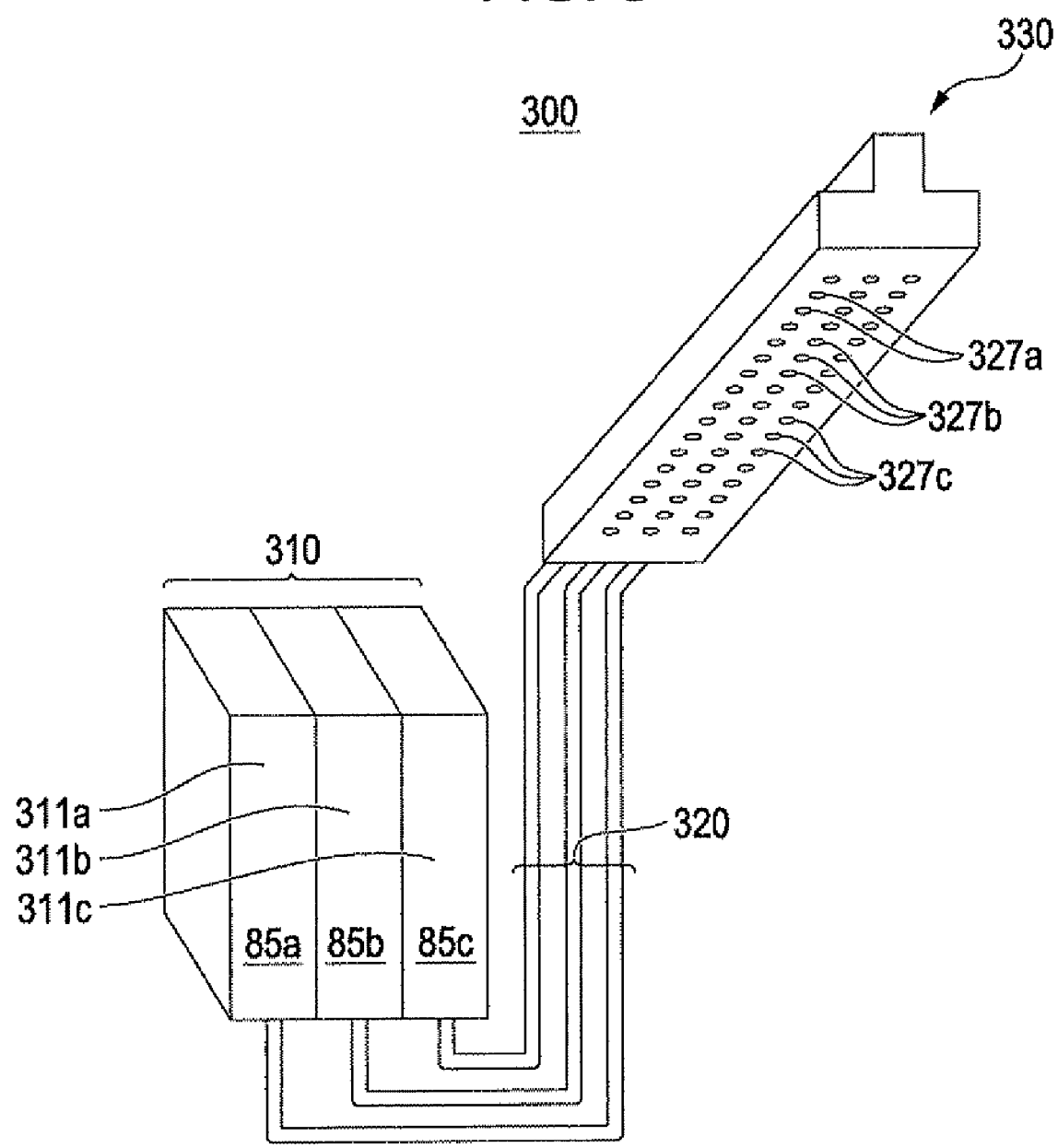
FIG. 8 is a diagram showing a structure for optimizing the functional layer-forming material concentration in the liquid matter as shown in FIG. 7 for the organic EL device and the liquid ejecting device of a first embodiment.

FIG. 5 is a diagram for describing the definition of the opening width of a recess surrounded by a partition wall in the organic EL device. FIGS. 6A to 6F are diagrams illustrating a method for making the organic functional layer 86 such as the light-emitting layer 82 or the hole injection layer 81 by ejecting the liquid matter 85 into recesses surrounded by the partition wall 5b formed on the element substrate 10. FIGS. 6A, 6B, and 6C show an example of making a high-resolution organic EL device, and FIGS. 6D, 6E, and 6F show an example of making a low-resolution organic EL device (opening width W1<opening width W2). FIG. 7 is a graph showing the optimum relationship between the opening width of the recess surrounded by the partition wall and the functional layer-forming material concentration (ink concentration) in the liquid matter to be filled in the recess in order to form the organic functional layer 100 nm in thickness according to the method of the embodiment. The results are calculated by assuming the contact angle θ between the liquid matter 85 and the partition wall 5b to be 60o, and the depth of the recess 5e (height h of the partition wall 5b) to be 2 μm. FIG. 8 is a diagram showing a structure for optimizing the functional layer-forming material concentration in the liquid matter as shown in FIG. 7 for the organic EL device and the liquid ejecting device of the first embodiment.

As described below, in making the electro-optic device 100, the functional layer-forming material concentration in the liquid matter is optimized according to the opening width of the recesses 5e after the liquid matter is filled in the recesses 5e surrounded by the partition wall 5b as shown in FIG. 3B and during removal of the solvent component from the liquid matter to thereby form organic functional layers. The shapes of the recesses 5e in plan may be circular, elliptical, square, rectangular, oblong, rectangular with rounded corners, etc., as shown in FIG. 5. In this specification, the term "opening width" means the maximum width of the opening in the transversal (short side) direction. Accordingly, if the planar shape of a recess 5e is circular, the opening width is the diameter. If the recess 5e is elliptical, the length of minor axis is the opening width. If the recess is square, the length of one side is the opening width. If the recess 5e is rectangular, the length of a short side is the opening with. If the recess 5e is oblong, the length of the short axis is the opening width. If the recess 5e is rectangular with rounded corners, the length of a short side is the opening width.

Referring now to FIGS. 6A to 6C, in this embodiment, in making a high-resolution electro-optic device 100, the organic functional layer 86 is made by ejecting the liquid matter 85 from the liquid-ejecting apparatus 300 shown in FIG. 4 into the recesses 5e surrounded by the partition wall 5b to fill the recesses 5e with the liquid matter 85, and then removing the solvent component from the liquid matter 85 in the fixing step to form the organic functional layer 86. The element substrate 10 used in the high-resolution electro-optic device 100 has the recess 5e with a small opening with W1.

As shown in FIGS. 6D to 6F, in making a low-resolution electro-optic device 100 by using the same liquid-ejecting apparatus 300, the liquid matter 85 is also ejected from the liquid-ejecting apparatus 300 shown in FIG. 4 into the recesses 5e surrounded by the partition wall 5b to fill the recesses 5e with the liquid matter 85, and then the solvent component is removed from the liquid matter 85 to form the organic functional layer 86. The element substrate 10 used in the low-resolution electro-optic device 100 has the recesses 5e with a large opening with W2. In such a case, if the liquid matter 85 having the same functional layer-forming material concentration is filled in the recesses 5e so that the contact angle between the protruding meniscus of the liquid matter 85 and the partition wall 5b is θ, a thin organic functional layer 86 is formed in the recess 5e having a small opening width while a thick organic functional layer 86 is formed in the recess 5e with a large opening width due to the reason described above with reference to FIG. 13. In other words, organic functional layers 86 with different thickness will be formed.

Figure 13:
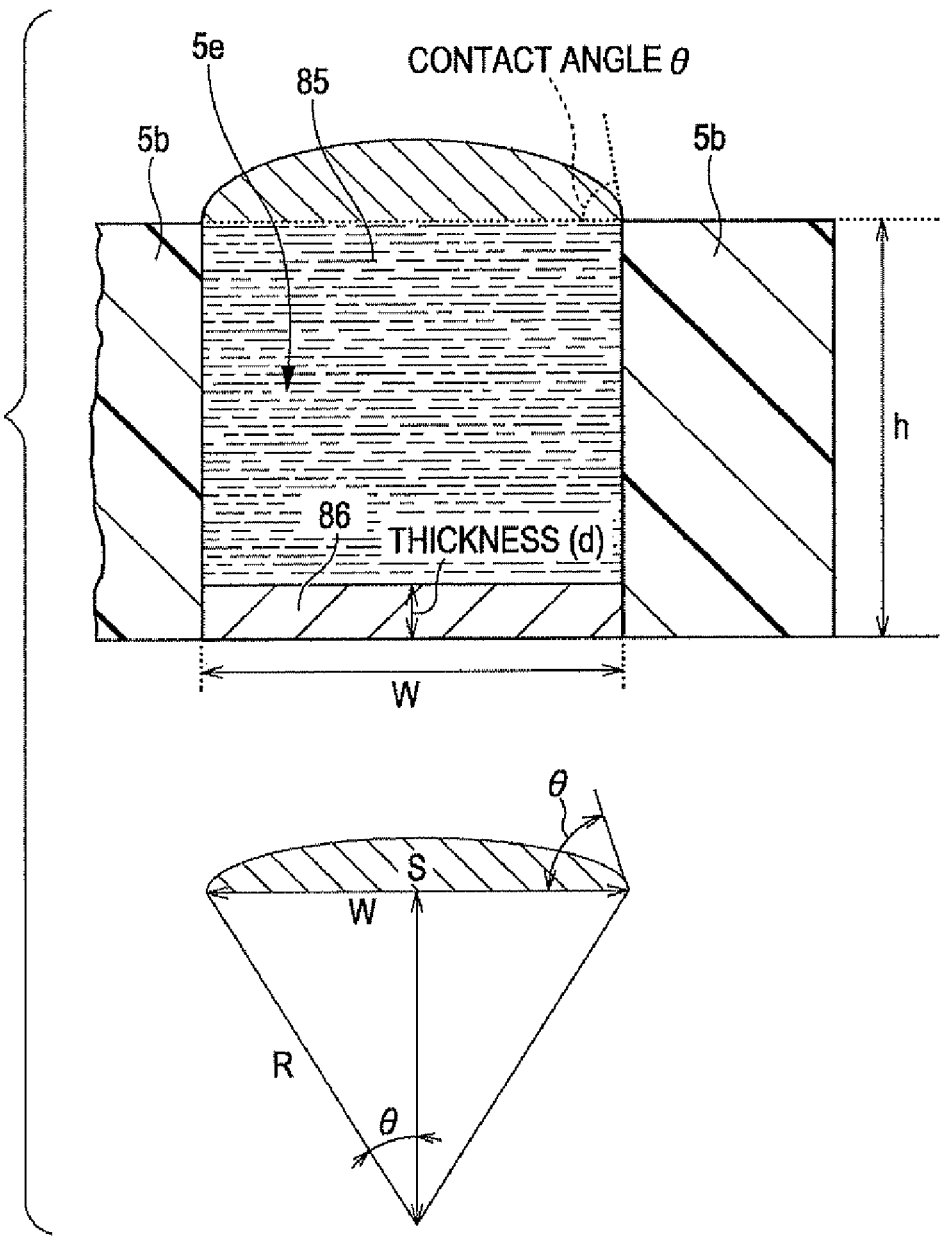
FIG. 13 is a diagram illustrating how a meniscus formed by filling a recess with liquid matter affects the thickness of an organic functional layer in a method for making an organic EL device.

Thus, in this embodiment, in the case where the opening width W1 of the recesses 5e is small as in the case of making a high-resolution electro-optic device 100, liquid matter 85 having a high functional layer-forming material concentration is filled in the recesses 5e by forming protruding meniscuses as shown in FIGS. 6A to 6C and 7 on the basis of the relationship between the opening width and the volume of the meniscus described with reference to FIG. 13. In contrast, in the case where the opening width W2 of the recesses 5e is large as in the case of forming a low-resolution electro-optic device 100, liquid matter 85 having a low functional layer-forming material concentration is filled in the recesses 5e by forming protruding meniscuses. For example, in the case where the opening width W1 of the recesses 5e is 40 μm, liquid matter 85 having a functional layer-forming material concentration of 0.98% is filled in the recesses 5e to form protruding meniscuses. In the case where the opening width W2 of the recesses 5e is 80 μm, liquid matter 85 having a functional layer-forming material concentration of 0.54% is filled in the recesses 5e to form protruding meniscuses. If the functional layer-forming material concentration is the same, since the amount of part of liquid matter 85 corresponding to the protruding meniscus becomes four times greater as the opening width is doubled, the resulting organic functional layers 86 will have different thickness, which is problem. However, this problem can be overcome by taking the above-described measures.

As shown in FIG. 8, the liquid-ejecting apparatus 300 of this embodiment used in implementing the above-described method includes concentration-set liquid matter supplying subunits 311a, 311b, and 311c for respectively supplying three types of liquid matter, 85a, 85b, and 85c having functional layer-forming material concentrations different from one another. The ejecting head 330 has three types of nozzle openings 327, namely, the concentration-set nozzle openings 327a, 327b, and 327c for respectively ejecting the liquid matter 85a, 85b, and 85c having different functional layer-forming material concentrations. The concentration-set nozzle openings 327a, 327b, and 327c are respectively connected to the concentration-set liquid matter supplying subunits 311a, 311b, and 311c.

The three types of liquid matter 85a, 85b, and 85c are respectively ejected from the concentration-set nozzle openings 327a, 327b, and 327c into each one of the recesses 5e. During this process, the balance of the amounts of the liquid matter 85a, 85b, and 85c discharged from the concentration-set nozzle openings 327a, 327b, and 327c of the ejecting head 330 into one recess 5e is controlled by a command from a controller unit to a driver unit of the liquid-ejecting apparatus 300 on the basis of the size of the opening width of the recess 5e. Thus, the liquid matter 85, i.e., a mixture of the liquid matter 85a, 85b, and 85c with different concentrations, having the optimum concentration fills each recess 5e.

For example, in the case where the liquid matter 85a, 85b, and 85c have functional layer-forming material concentrations of 0.5%, 1.0%, and 1.5%, respectively, and the numbers of 10 ng droplets ejected from the concentration-set nozzle openings 327a, 327b, and 327c into each recess 5e are given by a, b, and c (total: 14), respectively, the number of droplets should be set to satisfy the following equation:

Amount of liquid matter filled=10 ng×a+10 ng×b+10 ng×c=constant value

Since the amount of the functional layer-forming material filled is defined by the following equation:

Amount of functional layer-forming material=0.5%× 10 ng×a+1.0%×10 ng×b+1.5%×10 ng×c the functional layer-forming material concentration in the liquid matter 85 filled in the recess 5e can be adjusted to a predetermined value.

In the case where the amounts of droplets discharged from the concentration-set nozzle openings 327a, 327b, and 327c are d (ng), e (ng), and f (ng), respectively, the functional layer-forming material concentrations in the liquid matter 85a, 85b, and 85c are 0.5%, 1.0%, and 1.5%, respectively, and the numbers of droplets discharged from the concentration-set nozzle openings 327a, 327b, and 327c into each recess 5e are a, b, and c (total: 14), respectively, the number of droplets should be set to satisfy the following equation:

Amount of liquid matter filled=d ng×a+e ng×b+f ng×c=constant value

Since the amount of the functional layer-forming material is defined by the following equation:

Amount of functional layer-forming material=0.5%×d ng×a+1.0%×e ng×b+1.5%×f ng×c the functional layer-forming material concentration in the liquid matter 85 filled in the recess 5e can be adjusted to a predetermined value.

According to such a structure, the liquid matter 85 having an optimum functional layer-forming material concentration can be filled in each of the recesses 5e even when the recesses 5e have many different opening widths.

Second Embodiment

As in the first embodiment, the basic structure of the second embodiment is the same as those shown in FIGS. 4A to 4D, 6A to 6F, 7, and 8. Both the high-resolution electro-optic device 100 and the low-resolution electro-optic device 100 are made by ejecting the liquid matter 85 from the liquid-ejecting apparatus 300 into the recesses 5e surrounded by the partition wall 5b so as to fill the recesses 5e with the liquid matter 85 (filling step) and removing the solvent component from the liquid matter 85 to form the organic functional layer 86 (fixing step). During this process, as in the first embodiment, liquid matter 85 having a high functional layer-forming material concentration is filled in the recesses 5e having a large opening width W1 and liquid matter 85 having a low functional layer-forming material concentration is filled in the recesses 5e having a small opening width W2 so that protruding meniscuses are formed in both cases, as shown in FIGS. 6A to 6F and 7. Thus, even in the case where the amount of part of the liquid matter 85 corresponding to the protruding meniscus is not in proportion to the opening width, the problem of thickness variation among the organic functional layers 86 can be overcome.

As shown in FIG. 8 and as in the first embodiment, the liquid-ejecting apparatus 300 of the second embodiment used in implementing the above-described method includes concentration-set liquid matter supplying subunits 311a, 311b, and 311c for respectively supplying three types of liquid matter, 85a, 85b, and 85c having functional layer-forming material concentrations different from one another. The ejecting head 330 has three types of nozzle openings 327, namely, the concentration-set nozzle openings 327a, 327b, and 327c for respectively ejecting the liquid matter 85a, 85b, and 85c having different functional layer-forming material concentrations. The concentration-set nozzle openings 327a, 327b, and 327c are respectively connected to the concentration-set liquid matter supplying subunits 311a, 311b, and 311c.

Liquid matter is ejected into each recess 5e from one of the concentration-set nozzle openings 327a, 327b, and 327c. In other words, the ejecting head 330 is controlled to eject the liquid matter from only one of the concentration-set nozzle openings 327a, 327b, and 327c by a command from a controller unit to a driver unit of the liquid-ejecting apparatus 300 on the basis of the size of the opening width of the recess 5e. Thus, only the liquid matter 85 having the optimum concentration selected among the liquid matter 85a, 85b, and 85c is filled in each recess 5e. Thus, even in the cases where the recesses 5e have different opening widths, the problem of thickness variation among the organic functional layers 86 caused by part of the liquid matter 85 corresponding to the protruding meniscus can be overcome. In the example shown in FIG. 8, the concentration-set liquid matter supplying subunits 311a, 311b, and 311c for supplying three types of liquid with different concentrations are formed. Thus, this example is suitable for the cases in which the recesses 5e have three different opening widths.

Third Embodiment

Figure 9:
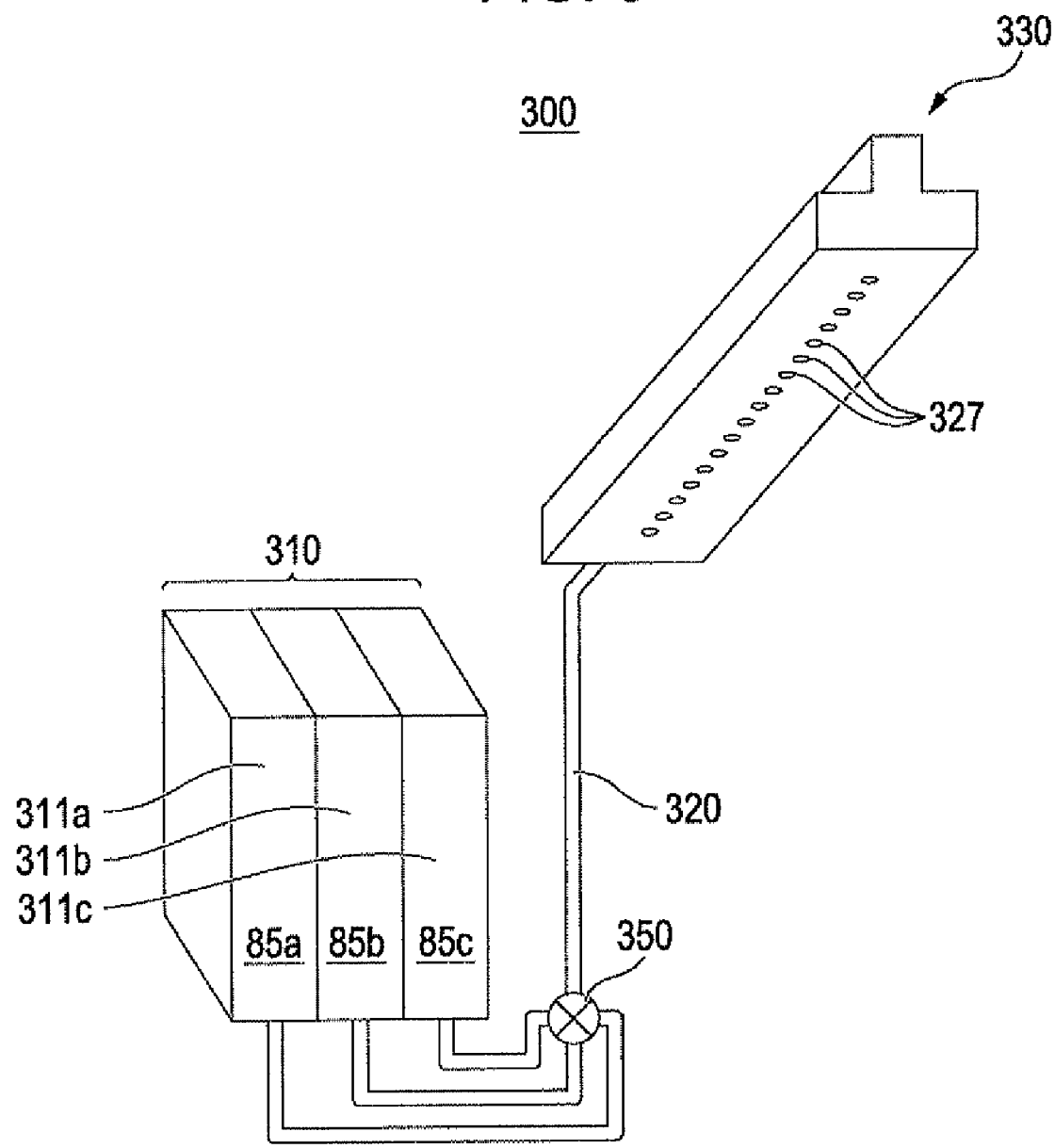
FIG. 9 is a diagram showing a structure for optimizing the functional layer-forming material concentration in the liquid matter as shown in FIG. 7 for an organic EL device and a liquid ejecting device of a third embodiment.

FIG. 9 is a diagram showing a structure for optimizing the functional layer-forming material concentration in the liquid matter as shown in FIG. 7 for an organic EL device 100 and a liquid ejecting device 300 of a third embodiment. As in the first embodiment, the basic structure of the third embodiment is the same as those shown in FIGS. 4A to 4D, 6A to 6F, and 7. Both the high-resolution electro-optic device 100 and the low-resolution electro-optic device 100 are made by ejecting the liquid matter 85 from the liquid-ejecting apparatus 300 into the recesses 5e surrounded by the partition wall 5b so as to fill the recesses 5e with the liquid matter 85 (filling step) and removing the solvent component from the liquid matter 85 to form the organic functional layer 86 (fixing step). During this process, as in the first embodiment, liquid matter 85 having a high functional layer-forming material concentration is filled in the recesses 5e having a large opening width W1 and liquid matter 85 having a low functional layer-forming material concentration is filled in the recesses 5e having a small opening width W2 so that protruding meniscuses are formed in both cases, as shown in FIGS. 6A to 6F and 7. Thus, even in the case where the amount of part of the liquid matter 85 corresponding to the protruding meniscus is not in proportion to the opening width, the problem of thickness variation among the organic functional layers 86 can be overcome.

As shown in FIG. 9, the liquid-ejecting apparatus 300 of this embodiment used in implementing the above-described method includes concentration-set liquid matter supplying subunits 311a, 311b, and 311c for respectively supplying three types of liquid matter, 85a, 85b, and 85c having functional layer-forming material concentrations different from one another. The ejecting head 330 is connected to the concentration-set liquid matter supplying subunits 311a, 311b, and 311c via a channel switching unit 350.

One of the liquid matter 85a, 85b, and 85c is ejected into one recess 5e. In other words, based on a command of a controller unit of the liquid-ejecting apparatus 300 to the channel switching unit 350, the channel switching unit 350 switches the channel 320 based on the size of the opening width of the recess 5e to switch the connection between the ejecting head 330 and the concentration-set liquid matter supplying subunits 311a, 311b, and 311c. Thus, only the liquid matter 85 having the optimum concentration selected among the liquid matter 85a, 85b, and 85c is filled in each recess 5e. Thus, even in the cases where the recesses 5e have different opening widths, the problem of thickness variation among the organic functional layers 86 caused by part of the liquid matter 85 corresponding to the protruding meniscus can be overcome. In the example shown in FIG. 9, the concentration-set liquid matter supplying subunits 311a, 311b, and 311c for supplying three types of liquid with different concentrations are provided. Thus, this example is suitable for the cases in which the recesses 5e have three different opening widths.

Fourth Embodiment

FIG. 10 is a diagram showing a structure for optimizing the functional layer-forming material concentration in the liquid matter as shown in FIG. 7 for an organic EL device 100 and a liquid ejecting device 300 of a fourth embodiment.

As in the first embodiment, the basic structure of the third embodiment is the same as those shown in FIGS. 4A to 4D, 6A to 6F, and 7. Both the high-resolution electro-optic device 100 and the low-resolution electro-optic device 100 are made by ejecting the liquid matter 85 from the liquid-ejecting apparatus 300 into the recesses 5e surrounded by the partition wall 5b so as to fill the recesses 5e with the liquid matter 85 (filling step) and removing the solvent component from the liquid matter 85 to form the organic functional layer 86 (fixing step). During this process, as in the first embodiment, liquid matter 85 having a high functional layer-forming material concentration is filled in the recesses 5e having a large opening width W1 and liquid matter 85 having a low functional layer-forming material concentration is filled in the recesses 5e having a small opening width W2 so that protruding meniscuses are formed in both cases, as shown in FIGS. 6A to 6F and 7. Thus, even in the case where the amount of part of the liquid matter 85 corresponding to the protruding meniscus is not in proportion to the opening width, the problem of thickness variation among the organic functional layers 86 can be overcome.

As shown in FIG. 10, the liquid matter supplying unit 310 of the liquid-ejecting apparatus 300 of the fourth embodiment used in implementing the above-described method includes two liquid material reservoirs 311e and 311f for respectively storing two types of liquid materials 85e and 85f for preparing the liquid matter 85. The ejecting head 330 is connected to the liquid material reservoirs 311e and 311f via a mixer 360.

Of the liquid materials 85e and 85f, the liquid material 85e is a liquid material having a functional layer-forming material concentration higher than that usually employed, and the liquid material 85f is a solvent. Alternatively, the liquid material 85e may be a liquid material having a functional layer-forming material concentration higher than that usually employed and the liquid material 85f may be a liquid material having a functional layer-forming material concentration lower than that usually employed. The liquid materials 85e and 85f are mixed at an appropriate ratio and the resulting mixture is ejected into the recesses 5e. During this process, if the opening width of the recess 5e is small, only the liquid material 85e may be discharged and if the opening width of the recess 5e is large, only the liquid material 85f with a low concentration may be discharged so that a mixture of the liquid materials 85e and 85f at a predetermined ratio may be discharged only if the opening width of the recess 5e is at an intermediate level. In all cases, the mixing ratio of the liquid materials 85e and 85f is changed by the mixer 360 on the basis of the size of the opening width of the recess 5e by the command from the controller unit of the liquid-ejecting apparatus 300 to the mixer 360. Thus, liquid matter 85 having a concentration suitable for the size of the opening width of the recess 5e is ejected into the recess 5e. Thus, even in the cases where the recesses 5e have different opening widths, the problem of thickness variation among the organic functional layers 86 caused by part of the liquid matter 85 corresponding to the protruding meniscus can be overcome.

According to such a structure, the liquid matter 85 having an optimum functional layer-forming material concentration can be filled in each of the recesses 5e even when the recesses 5e have many different opening widths.

Other Embodiments

According to the embodiments described above, a top-emission organic EL device is described as an example of the electro-optic device 100. Alternatively, the invention may be applied to a bottom-emission organic EL device.

Moreover, in the embodiments described above, the opening widths of the recess 5e are varied according to the resolution. However, the invention is also applicable to cases in which the opening widths of the recesses 5e are made different for other reasons. In the embodiments described above, the recesses 5e with different opening widths are formed in different substrates. However, the invention is also applicable to cases in which the recesses 5e with different opening widths are formed in the same substrate.

In the embodiments above, prevention of thickness variation in the organic functional layers 86 due to meniscuses is the objective. Thus, liquid matter 85 having a low concentration is filled in the recesses 5e with a small opening width and liquid matter 85 having a high concentration is filled in the recesses 5e with a large opening width. However, if the liquid matter 85 having the same functional layer-forming material concentration must be filled in the recesses 5e due to the shape of the sidewalls of the partition wall 5b or the structure of the recesses 5e and thickness variation of the organic functional layers 86 must be resolved, the liquid matter 85 having a low concentration may be filled in the recesses 5e with a small opening width and the liquid matter 85 having a high concentration may be filled in the recesses 5e with a large opening width.

In the embodiments described above, the invention is applied to forming organic functional layers 86 of the organic EL element 80. However, the invention is also applicable to making of a color filter substrate of such an electro-optic device 100 (substrate for electro-optical apparatus) or a color filter substrate of a liquid crystal apparatus (substrate for electro-optical apparatus).

Examples of Incorporation of Electro-Optic Device in Electronic Apparatus

Figure 11A:
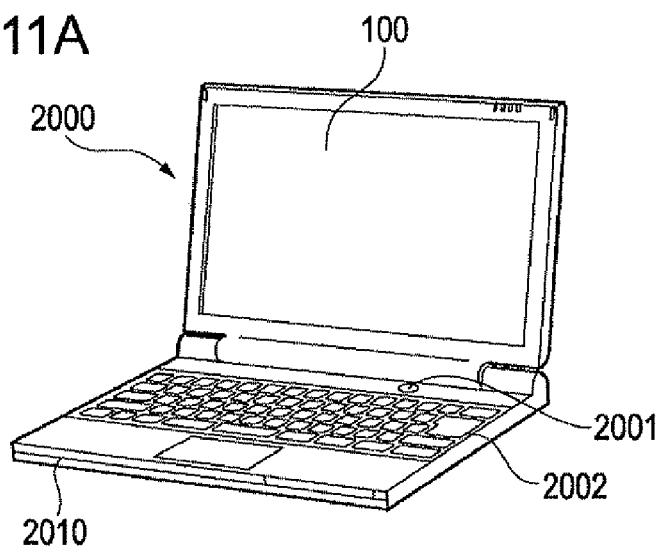
FIG. 11A to 11C are diagrams illustrating electronic apparatuses incorporating electro-optic devices.

Next, electronic apparatuses incorporating the electro-optic devices 100 of the embodiments described above are described. FIG. 11A shows a structure of a mobile personal computer incorporating the electro-optic device 100. A personal computer 2000 includes the electro-optic device 100 serving as a display unit and a main unit 2010. The main unit 2010 includes a power switch 2001 and a keyboard 2002. FIG. 11A shows a structure of a cellular phone incorporating the electro-optic device 100. A cellular phone 3000 includes a plurality of operation keys 3001 and scroll keys 3002, and the electro-optic device 100 serving as a display unit. The contents displayed in the electro-optic device 100 can be scrolled by operating the scroll keys 3002. FIG. 11C shows a structure of a personal digital assistant (PDA) incorporating the electro-optic device 100. A PDA 4000 includes a plurality of operation keys 4001, a power switch 4002, and the electro-optic device 100 serving as a display unit. Various types of information such as address list, daily planner, and the like are displayed in the electro-optic device 100 by operating the power switch 4002.

Figure 11B:
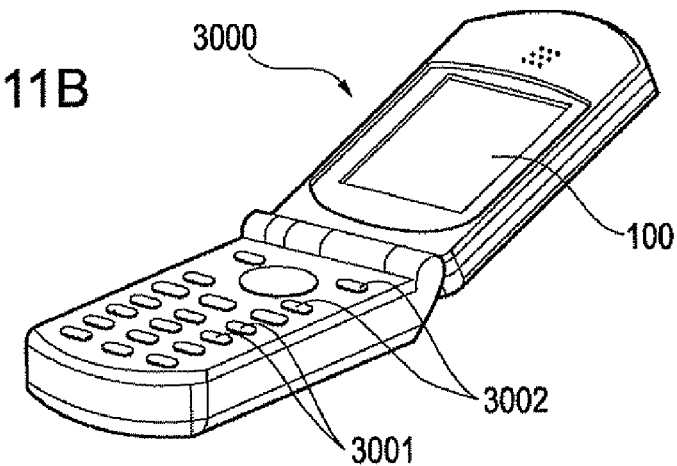
Figure 11C:
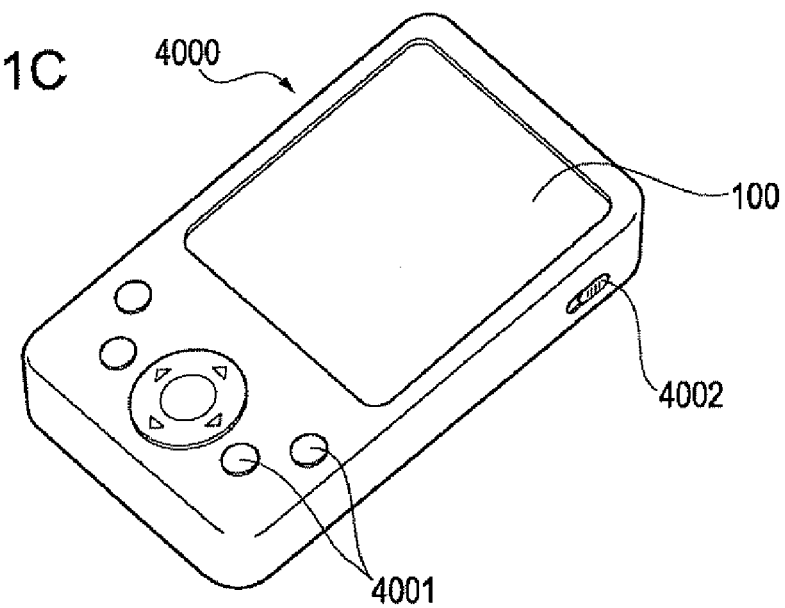

Examples of the electronic apparatuses incorporating the electro-optic devices 100 other than these illustrated in FIGS. 11A to 11C include digital still cameras, liquid crystal televisions, viewfinder-type and monitor direct-type video tape recorders, car navigation systems, pagers, electronic databooks, calculators, word processors, work stations, videophones, POS terminals, and other equipment with touch panels. The electro-optic device 100 described above can be used as the display unit of these electronic apparatuses. When the electro-optic device 100 is an organic EL device, it can also be used as an exposure head of a copying machine or the like.

The entire disclosure of Japanese Patent Application No. 2007-333658, filed Dec. 26, 2007 is expressly incorporated by reference herein.

What is claimed is:

1. A method for making an electro-optic device, comprising:
    a filling step of ejecting liquid matter containing a solvent and a functional layer-forming material into a plurality of recesses having different opening widths formed in at least one substrate to fill the recesses with the liquid matter; and
    a fixing step of removing a solvent component from the liquid matter to fix the functional layer-forming material in the recesses,
    wherein, in the filling step, the concentration of the functional layer-forming material in the liquid matter filling each recess is changed on the basis of the size of an opening width of the recess.

2. The method according to claim 1, wherein, in the filling step, the liquid matter fills each recess until the liquid matter forms a protruding meniscus; and
    the liquid matter filling a recess having a relatively small opening width has a functional layer-forming material concentration higher than that of the liquid matter filling a recess having a relatively large opening width.

3. The method according to claim 1, wherein the concentration of the functional layer-forming material in the liquid matter filling the recesses is changed on the basis of the size of the opening width by using a plurality of types of liquid matter having different functional layer-forming material concentrations and adjusting the balance of amounts of the plurality of types of liquid matter to be ejected into each recess according to the size of the opening width.

4. The method according to claim 1, wherein the concentration of the functional layer-forming material in the liquid matter filling the recesses is changed on the basis of the size of the opening width by adjusting the functional layer-forming material concentration of the liquid matter to be ejected to each recess according to the size of the opening width.

5. The method according to claim 1, wherein the recesses having different opening widths are formed in different substrates.

6. The method according to claim 1, wherein the functional layer-forming material is used to form an organic functional layer of an organic electroluminescent element on the substrate.

* * * * *